(12) United States Patent
Yu et al.

(10) Patent No.: US 11,721,782 B2
(45) Date of Patent: Aug. 8, 2023

(54) SCHOTTKY CONTACT-BASED LIGHT DETECTION DEVICE AND LIGHT DETECTION METHOD USING SAME

(71) Applicant: KOREA ADVANCED INSTITUTE OF SCIENCE AND TECHNOLOGY, Daejeon (KR)

(72) Inventors: Kyoung Sik Yu, Daejeon (KR); Yeong Hoon Jin, Daejeon (KR); Hyung Suk Kim, Daejeon (KR); Seung Hyup Yoo, Daejeon (KR)

(73) Assignee: KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 0 days.

(21) Appl. No.: 17/326,603

(22) Filed: May 21, 2021

(65) Prior Publication Data

US 2021/0367092 A1 Nov. 25, 2021

(30) Foreign Application Priority Data

May 21, 2020 (KR) .......................... 10-2020-0060716

(51) Int. Cl.
| | |
|---|---|
| *H01L 31/00* | (2006.01) |
| *H01L 31/108* | (2006.01) |
| *H01L 27/146* | (2006.01) |
| *H04N 5/33* | (2023.01) |
| *H10K 30/80* | (2023.01) |

(52) U.S. Cl.
CPC ...... *H01L 31/108* (2013.01); *H01L 27/14649* (2013.01); *H01L 27/14689* (2013.01); *H04N 5/33* (2013.01); *H10K 30/80* (2023.02)

(58) Field of Classification Search
CPC ............. H01L 31/108; H01L 27/14649; H01L 27/14689; H01L 51/44; H01L 51/4206; H01L 27/14665; H04N 5/33; Y02E 10/549
See application file for complete search history.

(56) References Cited

U.S. PATENT DOCUMENTS

| | | | |
|---|---|---|---|
| 2006/0231954 A1* | 10/2006 | Yan ...................... | H01L 51/441 257/E33.062 |
| 2011/0083720 A1* | 4/2011 | Merkle ................... | H02S 30/10 136/246 |

(Continued)

FOREIGN PATENT DOCUMENTS

| | | |
|---|---|---|
| JP | 2006-66535 A | 3/2006 |
| JP | 2007042685 A * | 2/2007 |

(Continued)

OTHER PUBLICATIONS

Korean Office Action dated Dec. 16, 2020 in counterpart Korean Patent Application No. 10-2020-0060716 (6 pages in Korean).

*Primary Examiner* — Samuel Park
(74) *Attorney, Agent, or Firm* — NSIP Law (57) ABSTRACT

The present disclosure relates to a light detection device including: a substrate 100; a lower electrode 200 formed on the substrate; an organic semiconductor layer 300 formed on the lower electrode 200; and an upper electrode 400 formed on the organic semiconductor layer 300, wherein a Schottky contact is formed at least one of a junction between the organic semiconductor layer and the lower electrode or a junction between the organic semiconductor layer and the upper electrode.

8 Claims, 11 Drawing Sheets

(56) References Cited

U.S. PATENT DOCUMENTS

| | | | | |
|---|---|---|---|---|
| 2011/0100431 A1* | 5/2011 | Horng | .................. | H01L 27/302 |
| | | | | 257/E31.11 |
| 2021/0151524 A1* | 5/2021 | Tang | .................. | G06V 40/1318 |

FOREIGN PATENT DOCUMENTS

| | | | |
|---|---|---|---|
| JP | 2014179374 A | * | 9/2014 |
| KR | 2000-0048012 A | | 7/2000 |
| KR | 10-0729021 B1 | | 6/2007 |
| KR | 10-1412502 B1 | | 6/2014 |

\* cited by examiner

SCHOTTKY CONTACT-BASED LIGHT DETECTION DEVICE AND LIGHT DETECTION METHOD USING SAME

CROSS-REFERENCE TO RELATED APPLICATIONS

This application claims the benefit under 35 USC § 119(a) of Korean Patent Application No. 10-2020-0060716 filed on May 21, 2020, in the Korean Intellectual Property Office, the entire disclosure of which is incorporated herein by reference for all purposes.

TECHNICAL FIELD

The present disclosure relates to a Schottky contact-based light detection device and a light detection method using the same, more particularly to a Schottky contact-based light detection device which can detect light even in a flexible state, can be embodied with large area, has polarization insensitivity to light incident angle and can absorb and detect light with high efficiency even in a thin-film metal state, and a light detection method using the same.

BACKGROUND ART

A light detection device or an optoelectric device for near infrared region has been studied intensively for application in missile smoke detection, spectroscopic sensors, image sensors, gas sensors, optical blood flow measurement, health monitoring, etc.

Among them, a metal-semiconductor-metal (MSM) type near infrared photodiode has characteristic advantages in that it has the feature of a Schottky barrier photodiode and is capable of detecting energy smaller than the band gap of a semiconductor.

For example, Korean Patent Registration No. 10-1412502 discloses a light detection device having a plurality of semiconductor layers and a contact electrode therewith and a method for manufacturing the same.

Since the existing light detection device includes an inorganic semiconductor layer (e.g., GaN) detecting light in a specific wavelength range, it is difficult to embody a flexible light detection device with large area.

Accordingly, a new type of light detection device capable of detecting light in the near infrared region and a method for manufacturing the same are necessary.

DISCLOSURE

Technical Problem

The present disclosure is directed to providing a new light detection device which is flexible and has a large area, and can detect light in a desired wavelength range (e.g., near infrared or ultraviolet), and a method for manufacturing the same.

Technical Solution

The present disclosure provides a light detection device including: a substrate 100; a lower electrode 200 formed on the substrate; an organic semiconductor layer 300 formed on the lower electrode 200; and an upper electrode 400 formed on the organic semiconductor layer 300, wherein a Schottky contact is formed at at least one of a junction between the organic semiconductor layer and the lower electrode or a junction between the organic semiconductor layer and the upper electrode.

In an exemplary embodiment of the present disclosure, light irradiated to the light detection device is irradiated to the upper electrode 400 or the lower electrode 200 which forms a Schottky contact with the organic semiconductor layer 300, a carrier is generated at the upper electrode 400 or the lower electrode 200 which forms a Schottky contact with the organic semiconductor layer, and, when the energy level of the generated carrier exceeds the energy barrier of the Schottky contact, the carrier is transported to the organic semiconductor layer 300 and current is detected by a counter electrode.

In an exemplary embodiment of the present disclosure, the substrate 100 is a flexible substrate.

In an exemplary embodiment of the present disclosure, the organic semiconductor layer 300 includes at least one organic semiconductor layer unit.

In an exemplary embodiment of the present disclosure, the light detection device further includes another organic semiconductor layer which forms a Schottky contact with the lower electrode or the upper electrode which forms a Schottky contact with the organic semiconductor layer.

The present disclosure also provides a method for manufacturing the light detection device including a Schottky contact, which includes: a step of depositing a first electrode on a substrate; a step of forming an organic semiconductor layer on the first electrode; and a step of depositing a second electrode on the organic semiconductor layer, wherein a Schottky contact is formed between the organic semiconductor layer and the second electrode.

The present disclosure also provides a method for manufacturing the light detection device including a Schottky contact, which further includes a step of forming another organic semiconductor layer which forms a Schottky contact with the first electrode on the substrate.

In an exemplary embodiment of the present disclosure, the substrate is a flexible substrate and the organic semiconductor layer has flexibility corresponding to that of the flexible substrate.

In an exemplary embodiment of the present disclosure, the step of forming the organic semiconductor layer is performed by a deposition or solution process.

Advantageous Effects

A light detection device according to the present disclosure is based on a Schottky contact between an organic semiconductor and a metal. Particularly, it is advantageous in that it can be embodied conveniently through deposition without patterning, can be applied to a flexible substrate structure and can detect light incident from various angles because it has polarization insensitivity to light incident angle. Furthermore, since 80-90% or more light can be absorbed by a very thin metal of around 10 nm, high efficiency can be achieved even without patterning. In addition, it can be used for aesthetic purpose since its color can be controlled through light interference.

BEST MODE

The present disclosure can be changed variously and may have various exemplary embodiments. Hereinafter, specific exemplary embodiments will be illustrated and described in detail through drawings. However, the exemplary embodiments are not intended to limit the present disclosure and should be understood to include all changes, equivalents and substitutes included within the technical idea and scope of the present disclosure. In the following description of the present disclosure, specific description of known technology will be omitted if it is deemed to make the gist of the present disclosure unnecessarily vague.

In order to solve the problems of a light detection device described above, the present disclosure provides a light detection device which detects light in a desired wavelength range (e.g., near infrared or ultraviolet) using a Schottky contact between an organic semiconductor and a metal.

Since the device is based on an organic semiconductor, a flexible device which is less expensive than the existing inorganic light detection device can be embodied.

Furthermore, since the device has polarization insensitivity to light incident angle, it can detect light incident from various angles and polarized light, as will be described in more detail later.

In addition, when coherent perfect absorption is utilized, a carrier (hole or electron) may be generated as 80-90% of light is absorbed in a wide wavelength range by a metal thin film with a thickness of about 10 nm. Accordingly, a light detection device with superior efficiency can be embodied only with metal deposition without an additional patterning process for improving light absorption efficiency.

In addition, unlike the existing light detection device based on an opaque and thick inorganic material, the light detection device according to the present disclosure can be used for aesthetic purpose since its color can be controlled through resonance tuning and light interference by using a transparent organic material between two metals.

Hereinafter, the present disclosure is described in more detail through attached drawings.

Figure 1:
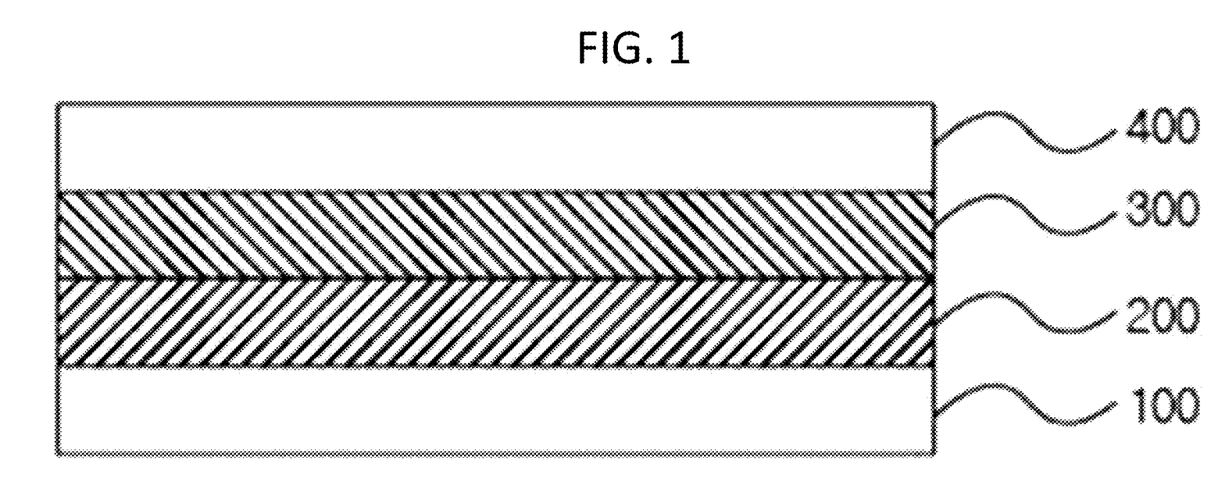
FIG. 1 is a cross-sectional view of light detection device according to an exemplary embodiment of the present disclosure.

FIG. 1 is a cross-sectional view of light detection device according to an exemplary embodiment of the present disclosure.

Referring to FIG. 1, a light detection device according to an exemplary embodiment of the present disclosure includes: a substrate 100; a lower electrode 200; an organic semiconductor layer 300 formed on the lower electrode 200; and an upper electrode 400 formed on the organic semiconductor layer 300, wherein a Schottky contact is formed at least one of a junction between the organic semiconductor layer 300 and the lower electrode 200 or the upper electrode 400.

Referring to FIG. 1, the mechanism of light detection for a case where a Schottky contact is formed between the lower electrode 200 and the organic semiconductor layer 300 will be described below. However, the present disclosure is not limited to the exemplary embodiment, but the case where a Schottky contact is formed between the lower electrode or another organic semiconductor layer and the upper electrode is also included in the scope of the present disclosure.

Figure 2:
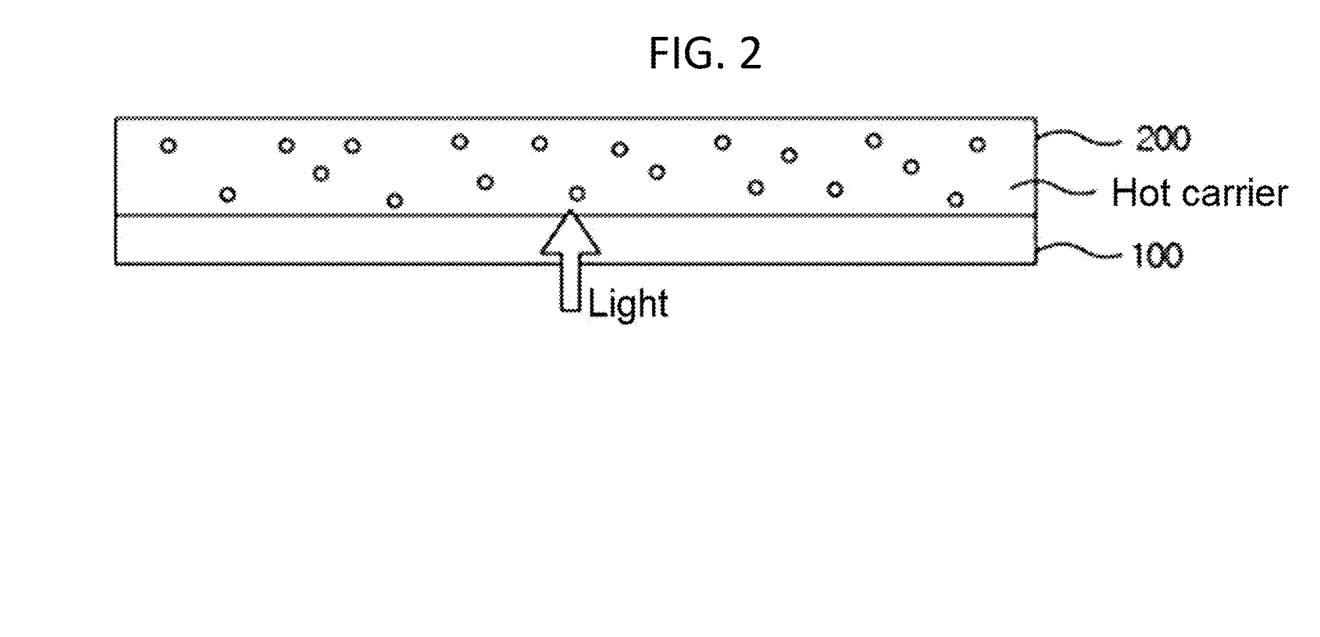
FIGS. 2-4 illustrate the principle of detection by the light detection device shown in FIG. 1.
Figure 3:
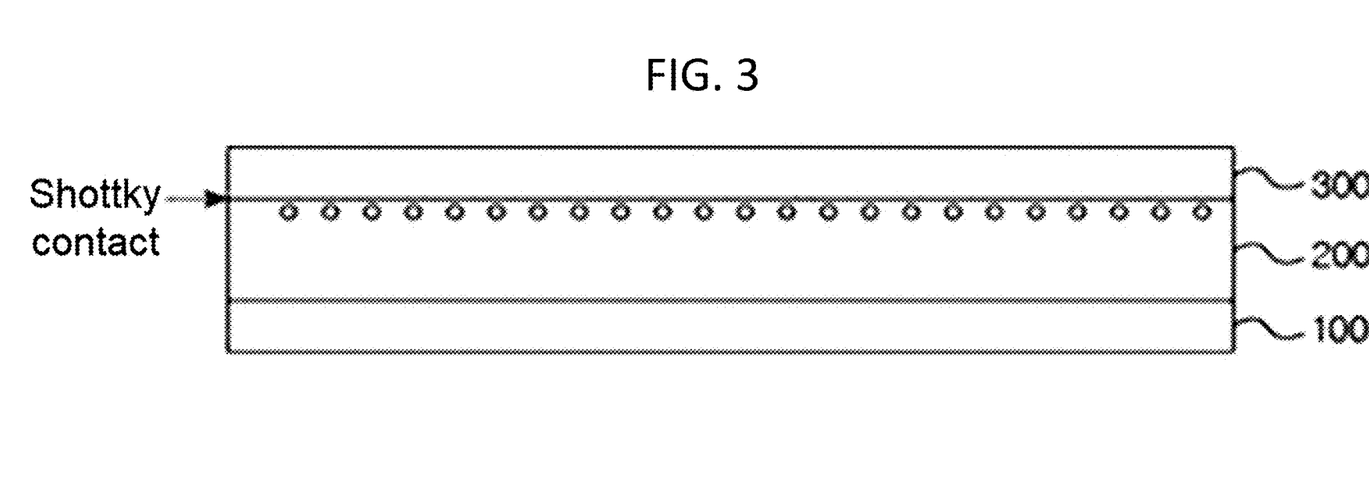
Figure 4:
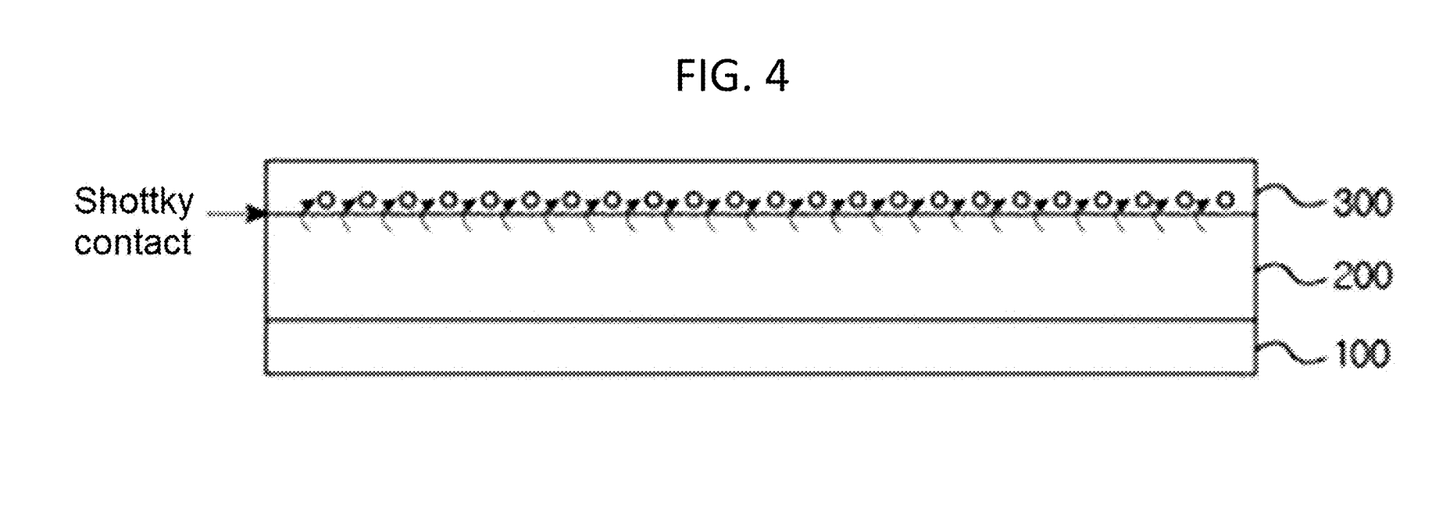

FIGS. 2-4 illustrate the principle of detection by the light detection device shown in FIG. 1.

First, referring to FIGS. 2-4, light is irradiated to the lower electrode 200 through the substrate (see FIG. 2). In an exemplary embodiment of the present disclosure, the substrate may be glass, etc. having transparency. If necessary, a polymer substrate such as flexible PET may also be used. In this case, a device layer such as the organic semiconductor layer may have flexibility corresponding to that of the flexible substrate.

Then, light in a wavelength range corresponding to metal characteristics is absorbed by the lower electrode 200 and, as a result, hot carriers (hot holes or hot electrons) are generated in the metal.

Some of the generated hot carriers are transported to the Schottky contact between the lower electrode 200 and the organic semiconductor layer 300 (see FIG. 3) and, if the energy level formed by the carriers exceeds the Schottky barrier, the carriers are transported to the organic semiconductor layer 300 and generate current at the organic semiconductor layer 300 (see FIG. 4).

Figure 5:
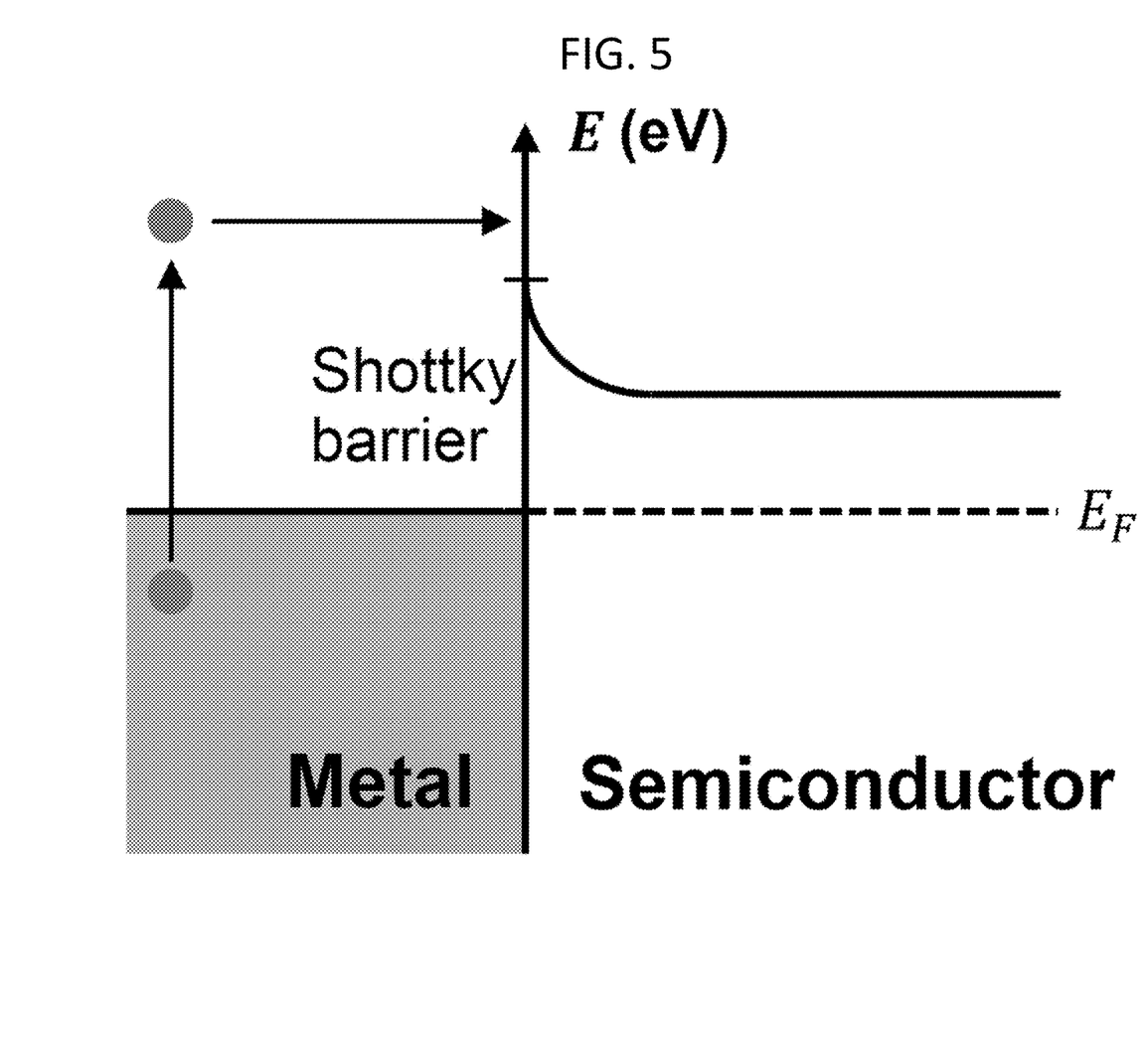
FIG. 5 is a schematic diagram of a Schottky barrier of a Schottky-based light detection device according to an exemplary embodiment of the present disclosure.

FIG. 5 is a schematic diagram of a Schottky barrier of a Schottky-based light detection device according to an exemplary embodiment of the present disclosure.

Referring to FIG. 5, in the organic semiconductor-based light detection device according to the present disclosure, light absorption occurs in the metal rather than in the semiconductor, unlike a general light detection device, and the wavelength range of the light is determined by the height of the Schottky barrier independently of the band gap of the semiconductor. Accordingly, there is an advantage that even the energy which is smaller than the band gap of the semiconductor can be detected. In particular, it is advantageous in that an inexpensive and flexible light detection device can be embodied because an organic semiconductor is used.

Figure 6:
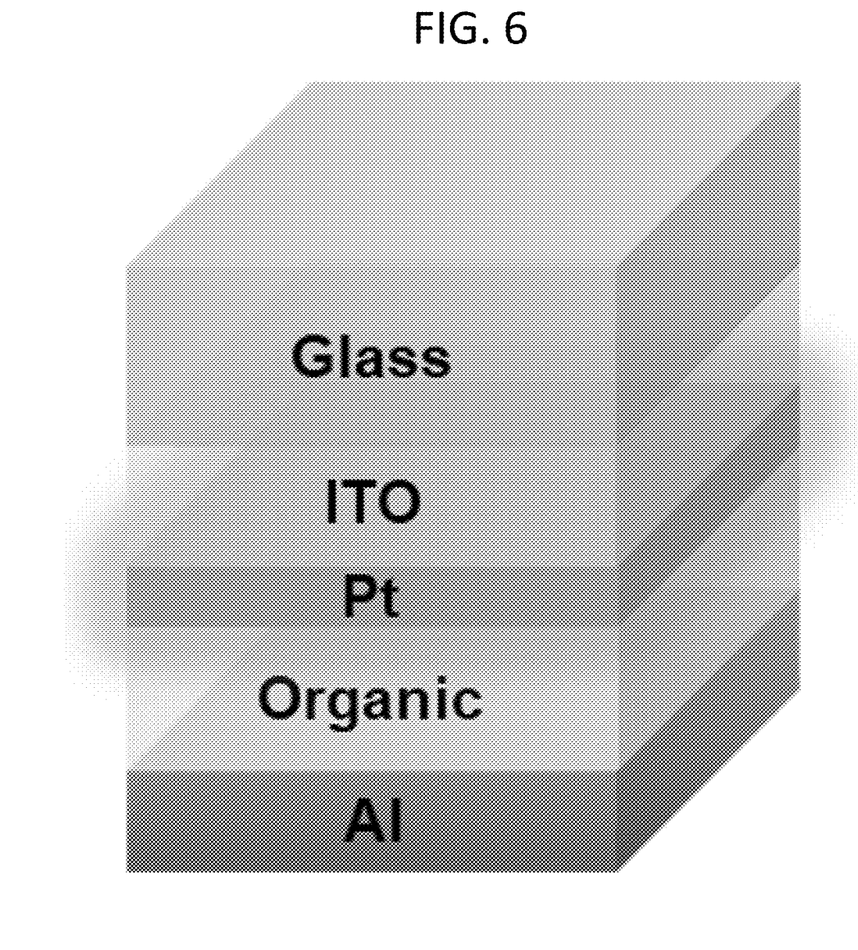
FIG. 6 is a schematic view of a light detection device using an organic Schottky contact manufactured according to an exemplary embodiment of the present disclosure.

FIG. 6 is a schematic view of a light detection device using an organic Schottky contact manufactured according to an exemplary embodiment of the present disclosure.

Referring to FIG. 6, the light detection device according to an exemplary embodiment of the present disclosure has a structure wherein an ITO layer is formed as a transparent electrode on a glass substrate, a light-absorbing platinum (Pt) layer is formed thereon as a first electrode, an organic semiconductor (1,4,5,8,9,11-hexaazatriphenylenehexacarbonitrile, hereinafter HAT-CN) layer is formed on the platinum (Pt) layer, and an aluminum layer is formed thereon as a second electrode. In the present disclosure, a Schottky barrier is formed between the platinum (Pt) layer and the organic semiconductor layer as described referring to FIG. 5. The height of the Schottky barrier is determined by the thickness and type of the organic semiconductor layer, the thickness and type of the metal, etc. In a wavelength range whose energy is larger than the barrier height, the hot carriers are transported to the organic semiconductor layer and current is generated.

In an exemplary embodiment of the present disclosure, the organic semiconductor layer may have a multi-layer structure including at least two or more organic semiconductor layer units. In addition, a complex Schottky structure wherein a Schottky contact is on both sides of the platinum layer as another organic semiconductor layer is contacted with the platinum layer is also possible.

In another exemplary embodiment of the present disclosure, the substrate may be a transparent flexible polymer substrate such as PET, etc. rather than the glass substrate.

A method for manufacturing a light detection device according to an exemplary embodiment of the present disclosure is as follows.

First, after depositing ITO on a glass substrate, the substrate was subjected to UV-ozone treatment for 10 minutes. Then, Pt, an organic semiconductor (HAT-CN) and Al were sequentially deposited thereon. Pt was evaporated with an e-beam evaporator, and the organic semiconductor and Al were evaporated with a thermal evaporator, although the scope of the present disclosure is not limited thereby. The organic semiconductor layer was encapsulated with glass for protection from moisture.

However, the scope of the present disclosure is not limited to the material types and method described above, and all are included in the scope of the present disclosure as long as a Schottky contact is formed at least between the organic semiconductor layer and the metal and the hot carriers generated at the metal due to light absorption are transported under the control by the Schottky barrier. For example, the organic semiconductor may be any carbon-containing organic semiconductor. For example, carbon nitride, a conjugated polymer, etc. may be used, and all of them are included in the scope of the present disclosure. And, the organic semiconductor layer may be formed by a deposition or solution process. Particularly, the present disclosure is advantageous in that a light detection device can be manufactured through a solution or deposition process only without a patterning process.

Figure 7:
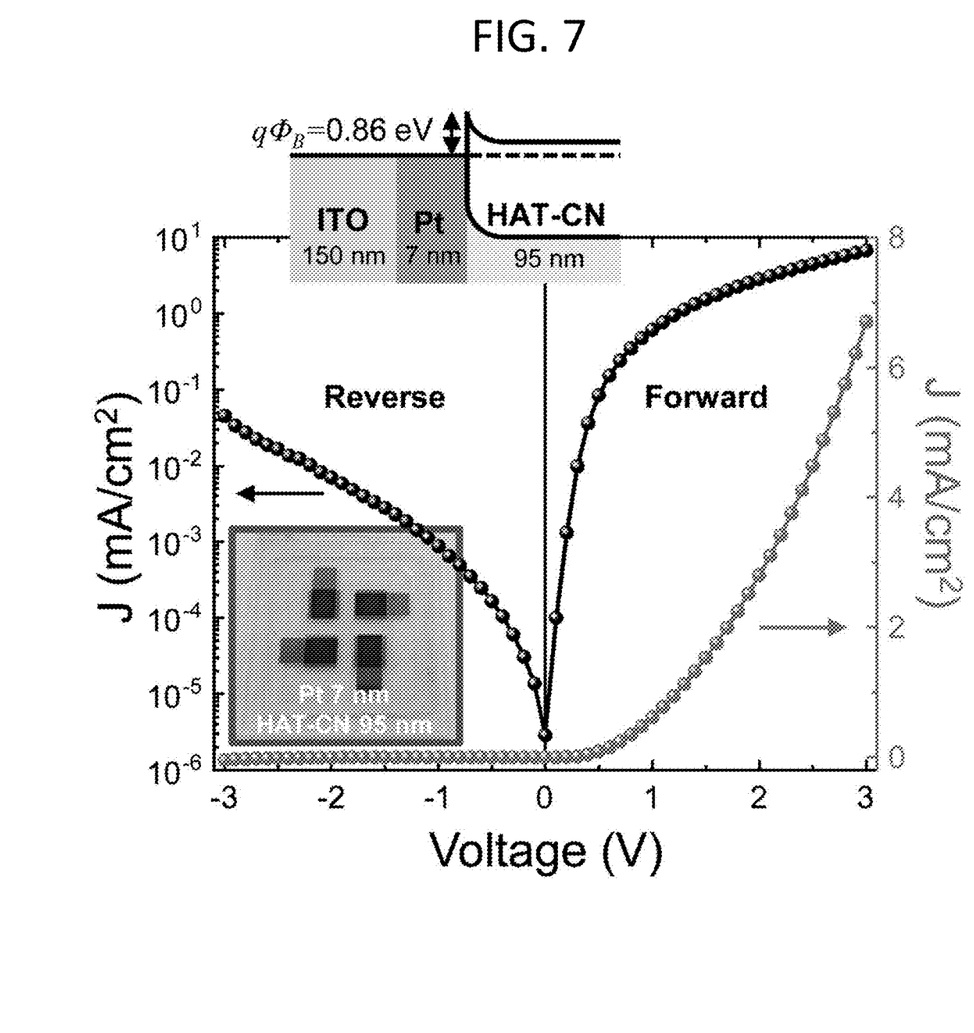
FIGS. 7 and 8 respectively show the I-V curve of a light detection device manufactured according to FIG. 6 and a detection result in the infrared region.
Figure 8:
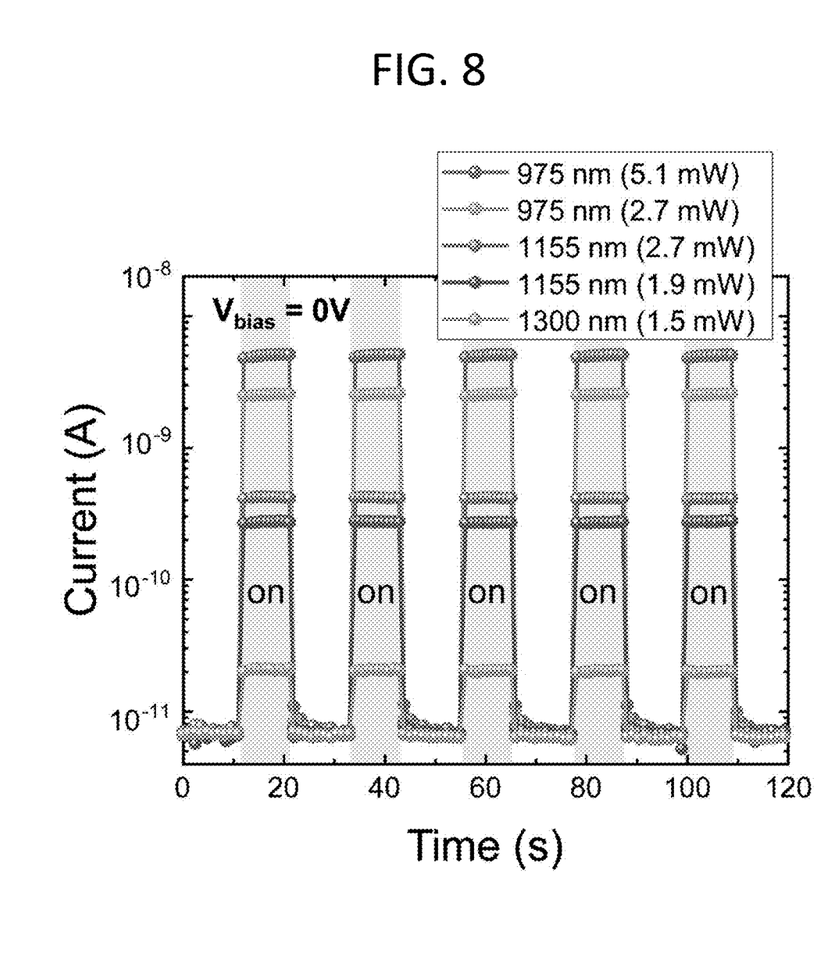

FIGS. 7 and 8 respectively show the I-V curve of the light detection device manufactured according to FIG. 6 and a detection result in the infrared region.

Referring to FIG. 7, it can be seen that a Schottky contact was formed in the light detection device according to FIG. 6 between the Pt metal and the HAT-CN organic semiconductor.

Referring to FIG. 8, it can be seen that light detection is possible in a wavelength range of 975-1300 nm. This means that light in the infrared region can be detected by tuning the Schottky barrier using different metals and organic materials.

Since the light detection device according to the present disclosure has superior light absorption efficiency and polarization insensitivity to light incident angle, it can detect light incident from various angles and polarized light, as will be described in detail below.

Figure 9:
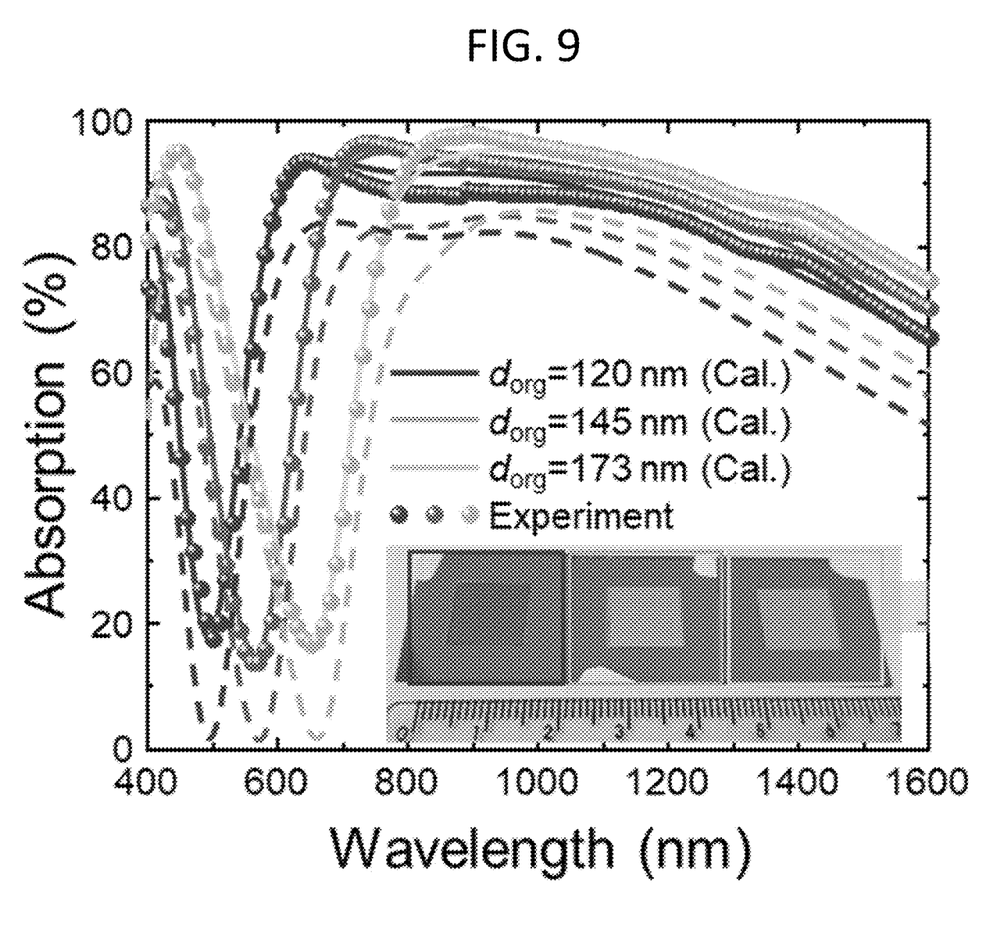
FIG. 9 shows light absorption.

FIG. 9 shows light absorption.

In FIG. 9, the solid lines indicate calculated values, the circular dots indicate measurement values, and the broken lines indicate absorption by Pt only. From FIG. 9, it can be seen that most light is absorbed by Pt.

Figure 10:
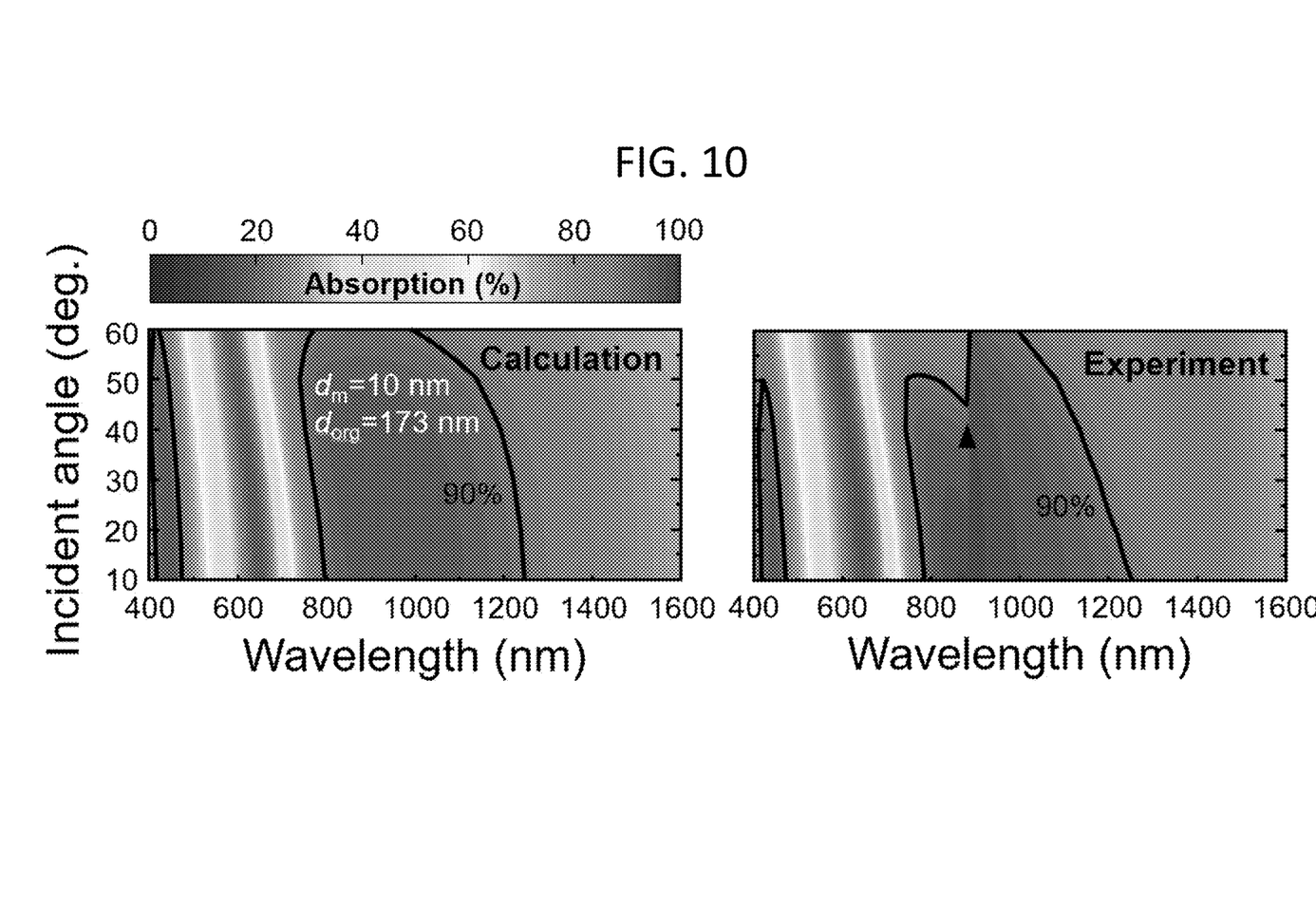
FIG. 10 shows an experimental result of testing polarization insensitivity to light incident angle.

FIG. 10 shows an experimental result of testing polarization insensitivity to light incident angle. The y-axis indicates incident angle (10-60°), and the x-axis indicates wavelength. Calculated absorption values (left) and measurement values (right) are shown.

From FIG. 10, it can be seen that 90% of light is absorbed even when the incident angle is 60°. This means that the light detection device using a Schottky contact between an organic semiconductor and a metal can detect light incident from various angles and polarized light.

The present disclosure also provides a method for manufacturing the light detection device including a Schottky contact.

Figure 11:
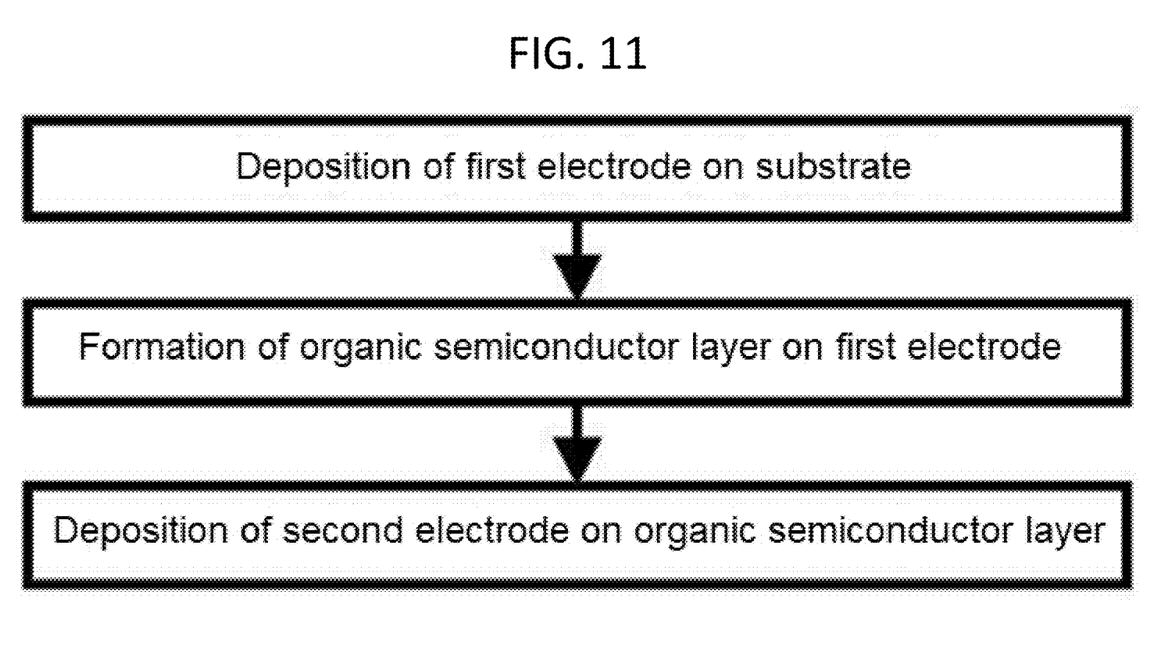
FIG. 11 is a flow diagram illustrating a method for manufacturing a light detection device according to an exemplary embodiment of the present disclosure.

FIG. 11 is a flow diagram illustrating the method for manufacturing a light detection device according to an exemplary embodiment of the present disclosure.

Referring to FIG. 11, the method for manufacturing a light detection device according to an exemplary embodiment of the present disclosure includes: a step of depositing a first electrode on a substrate; a step of forming an organic semiconductor layer on the first electrode; and a step of depositing a second electrode on the organic semiconductor layer, and a Schottky contact is formed between the organic semiconductor layer and the second electrode.

The method may further include a step of forming another organic semiconductor layer which forms a Schottky contact with the first electrode on the substrate. In addition, the substrate may be a flexible substrate, and the organic semiconductor layer may have flexibility corresponding to that of the flexible substrate.

The present disclosure is not limited by the foregoing exemplary embodiments and the attached drawings. It will be obvious to those having ordinary knowledge in the art to which the present disclosure belongs that substitutions, modifications and changes can be made within a range not departing from the technical idea of the present disclosure.

The invention claimed is:

1. A light detection device comprising:
   a substrate; a first organic semiconductor layer disposed on the substrate;
   a lower electrode disposed on the first organic semiconductor;
   a second organic semiconductor layer disposed on the lower electrode, wherein the second organic semiconductor layer comprises a multi-layer structure including at least two or more organic semiconductor layer units; and
   an upper electrode disposed on the second organic semiconductor layer,
   wherein a Schottky contact is formed between the first organic semiconductor layer and the lower electrode, and between the second organic semiconductor layer and the lower electrode.

2. The light detection device according to claim 1, wherein light irradiated to the light detection device is irradiated to the lower electrode, a carrier is generated at the lower electrode, and, when the energy level of the generated carrier exceeds the energy barrier of the Schottky contact, the carrier is transported to the first organic semiconductor layer or the second organic semiconductor layer, and current is detected by the upper electrode.

3. The light detection device according to claim 1, wherein the substrate is a flexible substrate.

4. The light detection device according to claim 1, wherein a Schottky contact is formed between the second organic semiconductor layer and the upper electrode.

5. A method for manufacturing a light detection device comprising a plurality of Schottky contacts, comprising:
   forming a first organic semiconductor layer on a substrate;
   forming a first electrode on the first organic semiconductor layer;
   forming a second organic semiconductor layer on a surface of the first electrode opposite to an interface between the first organic semiconductor layer and the first electrode, wherein the second organic semiconductor layer comprises a multi-layer structure including at least two or more organic semiconductor layer units; and forming a second electrode on the second organic semiconductor layer, wherein a Schottky contact is formed between the first organic semiconductor layer and the lower electrode, and between the second organic semiconductor layer and the lower electrode.

6. The method for manufacturing the light detection device comprising the plurality of Schottky contacts according to claim 5, wherein the forming the first organic semiconductor layer and the forming the second organic semiconductor layer are performed by a deposition or solution process.

7. The light detection device according to claim 4, wherein light irradiated to the light detection device is irradiated to the upper electrode, a carrier is generated at the upper electrode, and, when the energy level of the generated carrier exceeds the energy barrier of the Schottky contact, the carrier is transported to the second organic semiconductor layer, and current is detected by the lower electrode.

8. The method for manufacturing the light detection device comprising the plurality of Schottky contacts of claim 5 wherein a Schottky contact is formed between the second organic semiconductor layer and the upper electrode.

* * * * *